(12) United States Patent
Kim (10) Patent No.: US 8,547,068 B2
(45) Date of Patent: Oct. 1, 2013

(54) PROTECTION CIRCUIT MODULE AND SECONDARY BATTERY INCLUDING THE PROTECTION CIRCUIT MODULE

(75) Inventor: Bong Young Kim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1045 days.

(21) Appl. No.: 12/548,302

(22) Filed: Aug. 26, 2009

(65) Prior Publication Data

US 2010/0066307 A1 Mar. 18, 2010

Related U.S. Application Data

(60) Provisional application No. 61/098,215, filed on Sep. 18, 2008.

(51) Int. Cl.
*H02J 7/00* (2006.01)
*H02J 7/04* (2006.01)
*H02J 7/06* (2006.01)

(52) U.S. Cl.
USPC ........... 320/136; 320/132; 320/134; 320/154; 320/156; 320/158

(58) Field of Classification Search
CPC ...................................................... H02J 7/0031
USPC ........................................................ 320/136
See application file for complete search history.

(56) References Cited

U.S. PATENT DOCUMENTS

| | | | |
|---|---|---|---|
| 5,472,804 A | 12/1995 | Austin et al. | |
| 5,594,275 A | 1/1997 | Kwon et al. | |
| 7,615,858 B2 | 11/2009 | Eun | |
| 2002/0053744 A1 | 5/2002 | Sakamoto et al. | |
| 2002/0098319 A1 | 7/2002 | Takeichi et al. | |
| 2007/0145609 A1 | 6/2007 | Zhang et al. | |
| 2007/0222417 A1 | 9/2007 | Kim et al. | |
| 2008/0008910 A1* | 1/2008 | Koh ................................. | 429/7 |

FOREIGN PATENT DOCUMENTS

| | | |
|---|---|---|
| CN | 1106164 A | 8/1995 |
| CN | 1342037 A | 3/2002 |
| CN | 101119035 A | 2/2008 |
| CN | 101123248 A | 2/2008 |
| JP | 61-043461 | 3/1986 |
| JP | 61-207045 | 9/1986 |
| JP | 11-265960 | 9/1999 |
| JP | 2001-143672 | 5/2001 |
| JP | 2002-170910 | 6/2002 |
| JP | 2003-208880 | 7/2003 |

(Continued)

OTHER PUBLICATIONS

European Search Report dated Mar. 26, 2012, for corresponding European Patent application 09252228.3, 6 pages.

(Continued)

*Primary Examiner* — Edward Tso
*Assistant Examiner* — Ahmed Omar
(74) *Attorney, Agent, or Firm* — Christie, Parker & Hale, LLP (57) ABSTRACT

A protection circuit module (PCM) for a secondary battery including a bare cell is provided. The PCM includes: a flexible printed circuit board (FPCB); and control circuitry mounted on the FPCB via adhesive material and configured for electrical coupling to the bare cell through the FPCB. The control circuitry is adapted to control charging and discharging of the bare cell.

8 Claims, 4 Drawing Sheets

(56) References Cited

FOREIGN PATENT DOCUMENTS

| | | |
|---|---|---|
| JP | 2004-355837 | 12/2004 |
| JP | 2006-156402 | 6/2006 |
| JP | 2007-266067 | 10/2007 |
| KR | 10-2007-0021981 A | 2/2007 |
| KR | 10-0779505 | 11/2007 |
| KR | 10-0797693 | 1/2008 |
| KR | 10-0813626 | 3/2008 |
| KR | 10-2008-0048097 A | 6/2008 |

OTHER PUBLICATIONS

SIPO Office action dated Sep. 23, 2011, for application No. CN 200910173574.8, which claims priority to the present application, pp. 1-6, with English translation, 10 pps.

KIPO Notice of Allowance dated Sep. 23, 2011, for application No. KR 10-2009-0082157, which claims priority to the present application, 5 pps.

Chinese Office action dated Mar. 16, 2012 issued to corresponding Chinese Application No. 200910173574.8, 5 pages.

English translation of Chinese Office action dated Mar. 16, 2012 cited above, 8 pages.

Japanese Office action dated Aug. 21, 2012, for corresponding Japanese Patent application 2009-211541, (3 pages), Apr. 12, 2010.

Patent Abstracts of Japan, and English machine translation of Japanese Publication 11-265960 listed above, (24 pages), Sep. 28, 1999.

Patent Abstracts of Japan, and English machine translation of Japanese Publication 2003-208880 listed above, (12 pages), Jul. 25, 2003

Patent Abstracts of Japan, and English machine translation of Japanese Publication 2004-355837 listed above, (11 pages), Dec. 16, 2004.

Patent Abstracts of Japan, and English machine tranlsation of Japanese Publication 2007-266067 listed above, (18 pages), Oct. 11, 2007.

KIPO Office Action dated Jan. 18, 2011 for corresponding Korean Publication No. 10-2009-0082157, citing JP 2001-143672 listed above (4 sheets).

Patent Abstracts of Japan and Machine English Translation of JP 2001-143672 (6 sheets), May 25, 2001.

\* cited by examiner

PROTECTION CIRCUIT MODULE AND SECONDARY BATTERY INCLUDING THE PROTECTION CIRCUIT MODULE

CROSS-REFERENCE TO RELATED APPLICATION

This application claims priority to and the benefit of U.S. Provisional Patent Application No. 61/098,215, filed Sep. 18, 2008, the entire content of which is incorporated herein by reference.

BACKGROUND OF THE INVENTION

1. Field of the Invention

The present invention relates to a secondary battery, and more particularly to a protection circuit module and a secondary battery including the same.

2. Description of the Related Art

In recent years, due to the rapid development of communications and computer industries, the use of portable electronic devices have been increasing. Rechargeable secondary batteries are primarily being used as power sources for portable electronic devices.

Secondary batteries that include protection circuit modules (PCMs) for controlling charge and discharge thereof are being widely used. Due to the rapid miniaturization of the portable electronic devices using secondary batteries as the main power source, it is desirable to further reduce the size of the secondary batteries. In a conventional protection circuit module, various circuit devices are mounted on a printed circuit board (PCB). However, since the thickness of a printed circuit board itself is at least 0.5 mm, there is a limit to decreasing the thickness of the conventional protection circuit modules.

SUMMARY OF THE INVENTION

Exemplary embodiments according to the present invention provide a thin protection circuit module and a secondary battery including the same. According to exemplary embodiments of the present invention, a secondary battery includes a protection circuit module that is thin and safely protects a circuit device.

By way of example, since a die type circuit device is mounted to a flexible printed circuit board (hereinafter, referred to as 'FPCB'), a protection circuit module can be made thinner. Furthermore, when a circuit device is protected by a molded portion, insulation may be improved and damage to a circuit by an external impact may be reduced.

In an exemplary embodiment according to the present invention, a protection circuit module (PCM) for a secondary battery including a bare cell is provided. The PCM includes: a flexible printed circuit board (FPCB); and control circuitry mounted on the FPCB via adhesive material and configured for electrical coupling to the bare cell through the FPCB, the control circuitry being adapted to control charging and discharging of the bare cell.

The control circuitry may include a controller and a switch including a first switching device and a second switching device.

The adhesive material between the controller and the FPCB may be electrically insulating. A portion of the FPCB below the controller may have conductive material exposed to the adhesive material.

The adhesive material between the switch and the FPCB may be electrically conductive.

The adhesive material may have a thickness of about 0.03 mm or less. Further, the adhesive material may have a thickness of about 0.01 mm or less.

The PCM may further include a plurality of first wire bonding pads on the FPCB around the controller, wherein the controller is electrically coupled to the first wire bonding pads via first wires; and a plurality of second wire bonding pads on the FPCB around the first and second switching devices, wherein the first and second switching devices are electrically coupled to the second wire bonding pads via second wires. Each of the wire bonding pads may include a conductive material on an exposed copper of the FPCB. The conductive material may include gold.

Each of the wires may include a conductive material selected from the group consisting of gold, copper, aluminum, nickel, and combinations thereof.

None of the wires may extend greater than about 0.2 mm above an IC chip of the controller. Each of the wires may extend about 0.1 mm or less above the IC chip of the controller.

The PCM may further include a protector encapsulating the control circuitry on the FPCB. The protector may include a material selected from the group consisting of epoxy resin, silicon compound and combinations thereof. An upper end of the protector may be located about 0.1 mm or less above a highest point of wires between the control circuitry and the FPCB. The upper end of the protector may be located about 0.05 mm or less above the highest point of the wires between the control circuitry and the FPCB.

A distance measured from a lower surface of the FPCB opposite an upper surface on which the control circuitry is mounted and the top of the protector may be about 0.5 mm or less.

In another exemplary embodiment of the present invention, a secondary battery includes a bare cell; and a protection circuit module (PCM) electrically coupled to the bare cell. The PCM includes: a flexible printed circuit board (FPCB); control circuitry mounted on the FPCB via adhesive material and electrically coupled to the bare cell through the FPCB, the control circuitry being adapted to control charging and discharging of the bare cell; and external terminals electrically coupled to the control circuitry via the FPCB and for electrically coupling the bare cell to an external device.

The PCM in the secondary battery may have substantially the same features as the above described PCM.

BRIEF DESCRIPTION OF THE DRAWINGS

The features and aspects of the present invention will be more apparent from the following detailed description in conjunction with the accompanying drawings, in which.

DETAILED DESCRIPTION

Hereinafter, embodiments of the present invention will be described in detail with reference to the accompanying drawings.

Figure 1:
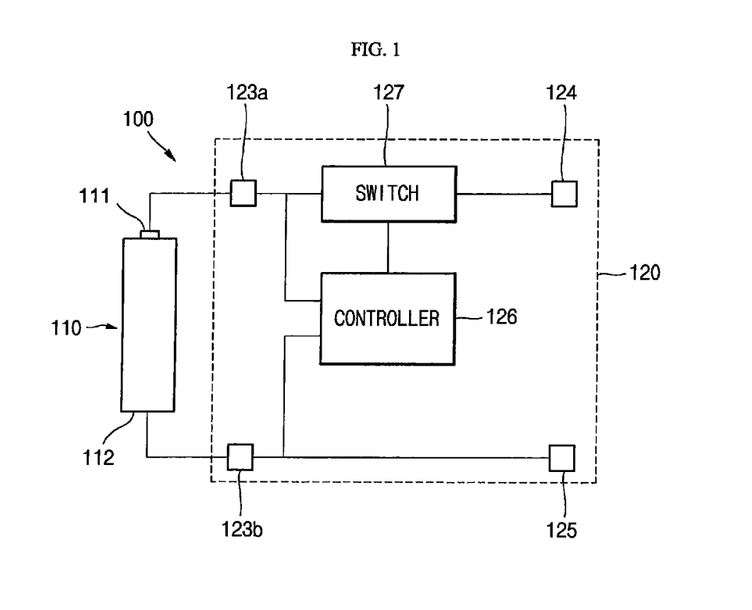
FIG. 1 is a block diagram illustrating a secondary battery including a protection circuit module according to an embodiment of the present invention.

Referring to the block diagram of FIG. 1, a secondary battery 100 includes a bare cell 110 and a protection circuit module (PCM) 120. The bare cell provides electric energy, and includes an electrode assembly, a can in which the electrode assembly and an electrolyte are received, and a cap assembly covering the can. The bare cell 110 includes a first electrode 111 and a second electrode 112. In the described embodiment, the first electrode 111 is a positive electrode and the second electrode 112 is a negative electrode, but the present invention is not limited thereto.

Referring to FIG. 1, a circuit formed in the protection circuit module 120 includes a first internal terminal 123a, a second internal terminal 123b, a first external terminal 124, a second external terminal 125, a controller 126, and a switch 127. The first internal terminal 123a is electrically connected to the first electrode 111 of the bare cell 110. The second internal terminal 123b is electrically connected to the second electrode 112. For example, a charger or an external load may be electrically connected to the first external terminal 124 and the second external terminal 125. The controller 126 outputs a control signal to the switch 127 using voltage information of the bare cell 110. In one embodiment, the switch 127 sets the direction of current so that only one of charge and discharge can be performed at a time, according to the control signal of the controller 126.

The protection circuit module 120 controls overall operation including charge and discharge of the bare cell 110. Those skilled in the art would understand that the protection circuit module 120 may include other electric circuit components such as resistors, capacitors, and temperature fuses without being limited thereto.

Figure 2:
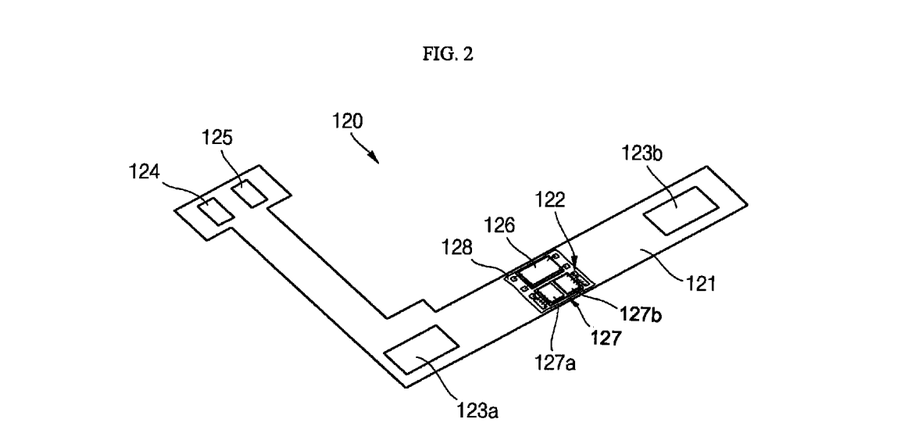
FIG. 2 is a perspective view of the protection circuit module illustrated in FIG. 1.

FIG. 2 illustrates the protection circuit module (PCM) 120 according to one embodiment of the present invention. Referring to FIG. 2, the protection circuit module 120 includes a flexible printed circuit board (FPCB) 121 and a chip mount 122 provided on the FPCB 121. Although the FPCB 121 is an elongated L-shaped strip in FIG. 2, the present invention is not limited thereto. By way of example, in other embodiments, the FPCB may have an elongated rectangular shape (or stripe shape). As discussed above, the FPCB 121 includes the first internal terminal 123a, the second internal terminal 123b, the first external terminal 124, and the second external terminal 125. The FPCB 121 has a thickness of approximately 0.1 mm. The chip mount 122 includes the controller 126, the switch 127, and a protector 128.

The controller 126 and the switch 127 may together be referred to as "control circuitry." In one embodiment, the control circuitry is mounted on the FPCB 121 via adhesive material and configured for electrical coupling to the bare cell through the FPCB 121. The control circuitry is adapted to control charging and discharging of the bare cell 110.

Figure 3:
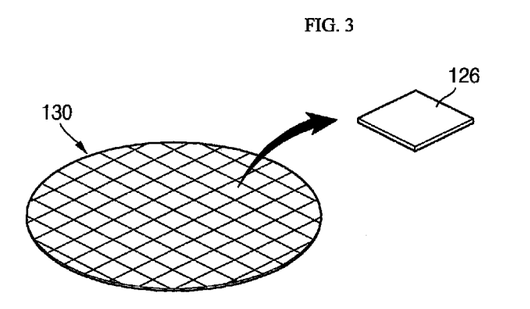
FIG. 3 is a perspective view of an electric circuit device on a semiconductor wafer used for the protection circuit module of FIG. 1.

As illustrated in FIG. 3, the controller 126 according to the described embodiment is implemented in a die type IC chip obtained from a semiconductor wafer 130.

Referring to FIGS. 4, 5A, 5B, and 7, the IC chip 126 is mounted on the FPCB 121 such that its surface on which a terminal is formed faces upward. The thickness of the IC chip 126 is approximately 0.2 mm, for example. The IC chip 126 is coupled to the FPCB 121 by a first die bonding pad 126a formed on the FPCB 121. The first die bonding pad 126a may be formed by coating an adhesive material on the FPCB 121. In one embodiment, an insulating epoxy resin is used as the first die bonding pad 126a. In other embodiments, the first die bonding pad 126a may be made of conductive adhesive material.

The thickness of the first die bonding pad 126a (i.e., the adhesive material) is approximately 0.03 mm, for example. In other embodiments, the thickness of the first die bonding pad 126a may be less than 0.03 mm. For example, the thickness of the first die bonding pad 126a may be 0.01 mm or less in some embodiments.

The first die bonding pad 126a is larger than the IC chip 126 in the described embodiment. For convenience of mounting, the first die bonding pad 126a has a shape similar to that of the IC chip 126. The ratio of dimensions between the first die bonding pad 126a and the IC chip 126 according to one embodiment is at least 1.2:1, but the present invention is not limited thereto. In other words, the length and width of the first die bonding pad 126a respectively are at least 1.2 times those of the IC chip 126 in one embodiment. In other embodiments, the ratio of dimensions may be more or less than 1.2.

Figure 4:
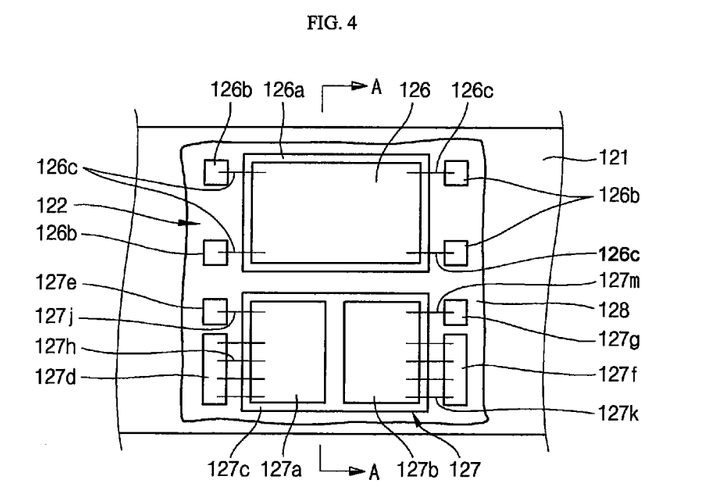
FIG. 4 is a plan view of the protection circuit module illustrated in FIG. 1, and illustrates a section where a control IC and a switching device are mounted.

In the embodiment illustrated in FIG. 4, four first wire bonding pads 126b spaced apart from the first die bonding pad 126a are disposed around the first die bonding pad 126a. The IC chip 126 is electrically coupled to the first wire bonding pads 126b via first wires 126c.

In one embodiment, each first wire bonding pad 126b is formed by plating a copper foil formed in the FPCB 121 with gold. In other words, an outer layer of the FPCB 121 is peeled to expose the underlying conductive layer (i.e., copper), and then gold is plated on it to form electrical contact. In other embodiments, the copper foil may be plated with any other suitable conductive material.

At least one of the first wires 126c is electrically connected to each first wire bonding pad 126b at one end by a method such as wire bonding. The width of the first wire bonding pad 126b in one embodiment is at least five times the diameter of the first wire 126c so that the first wire 126c can be easily connected to the first wire bonding pad 126b, but the present invention is not limited thereto.

The other ends of the first wires 126c are electrically connected to terminals of the IC chip 126 by a method such as wire bonding. When the first wires 126c are connected to the terminals formed on the upper surface of the IC chip 126, the upper ends of the first wires are located (or extend) not greater than approximately 0.2 mm above the IC chip 126 according to one embodiment. In other embodiments, the upper ends of the first wires may extend about 0.1 mm or less above the IC chip.

In one embodiment, the first wires 126c are made of gold, but the present invention is not limited thereto. In other embodiments, the first wires 126c may be made of a conductive material such as copper, aluminum, or nickel, as well as gold.

Figure 5A:
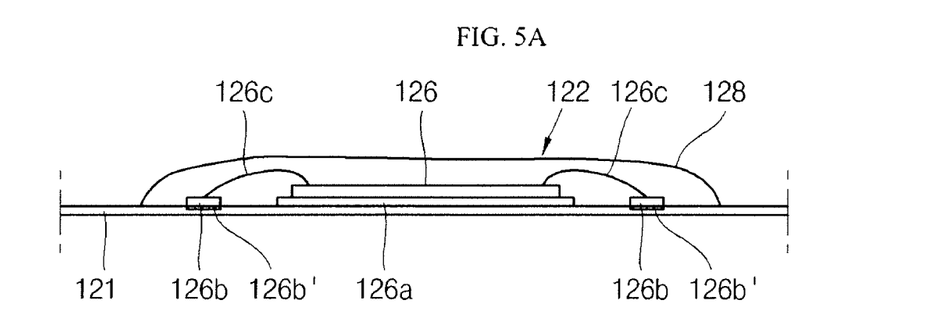
FIG. 5A is a side view of the protection circuit module illustrated in FIG. 3, and illustrates the control IC.

As can be seen in FIG. 5A, the first die bonding pad 126a can be mounted on the FPCB 121 without peeling (or removing) the external insulating layer of the FPCB 121. In this case, the material used for the pads can be either a conductive material (e.g., conductive epoxy) or an insulating material (e.g., insulating epoxy resin) because an electrical short between the IC chip 126 and the FPCB 121 is unlikely because of the external insulating layer.

It can be seen in FIG. 5A that the first wire bonding pads 126b are mounted on a portion of the FPCB 121 after peeling the external insulating layer to expose the underlying conductive material (e.g., copper foil.). Then a suitable conductive material (e.g., gold) is plated on the exposed conductive material of the FPCB 121 to form contacts 126b'. This way, electrical connections can be formed between the IC chip 126 and the FPCB 121 via the first wires 126c and the first wire bonding pads 126b.

Figure 5B:
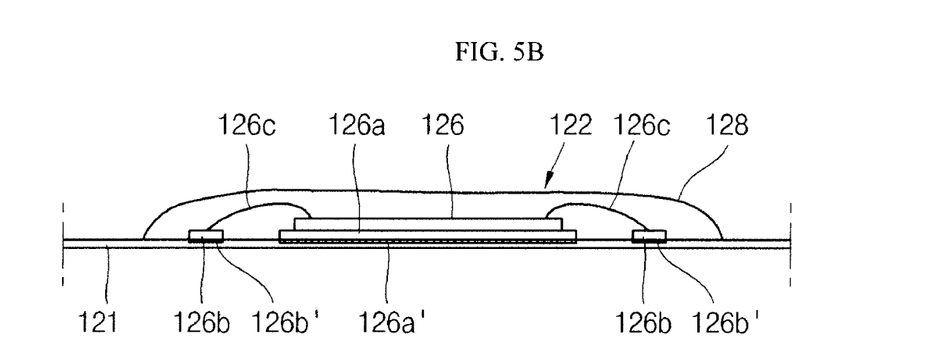
FIG. 5B is a side view of the protection circuit module according to another exemplary embodiment of the present invention.

In other embodiments, as can be seen in FIG. 5B, when the insulating layer of the FPCB 121 is removed to expose the conductive material (e.g., copper foil) 126a', the material used for the first die bonding pad 126a should be insulating material (e.g., insulating epoxy resin) so that undesirable electrical connections (i.e., a short) between the IC chip 126 and the FPCB 121 can be prevented.

Figure 6:
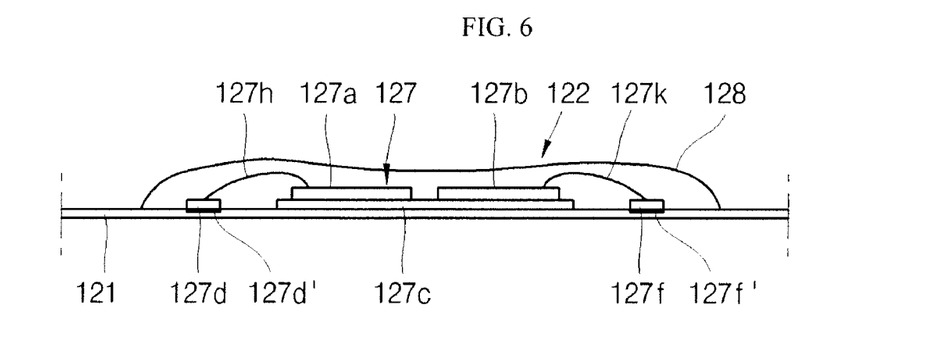
FIG. 6 is a side view of the protection circuit module illustrated in FIG. 3, and illustrates the switching device.
Figure 7:
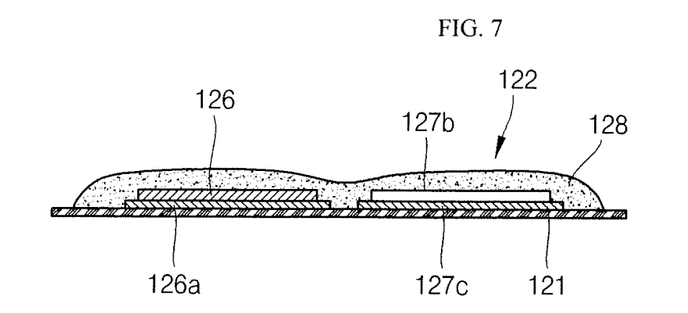
FIG. 7 is a sectional view of the protection circuit module illustrated in FIGS. 3 and 4 that is taken along the line A-A of FIG. 4.

Referring to FIGS. 4, 6, and 7, the switch 127 includes a first switching device 127a and a second switching device 127b. In one embodiment of the present invention, the switching devices 127a and 127b are field-effect transistors (FETs), but the present invention is not limited thereto. Any suitable device capable of performing a switching operation according to embodiments of the present invention may be used as the switching devices. In the described embodiment, the first switching device 127a and the second switching device 127b are die type FET chips obtained from a semiconductor wafer 130 similarly as the IC chip.

The first FET chip 127a and the second FET chip 127b are mounted on the FPCB 121 such that their surfaces on which a gate terminal and a source terminal are formed face upward and their surfaces on which a drain terminal are formed face downward. The thickness of the FET chips 127a and 127b is approximately 0.18 mm, for example.

The two FET chips 127a and 127b are mounted on and coupled to the FPCB 121 by a second die bonding pad 127c formed on the FPCB 121. The second die bonding pad 127c is formed by coating an adhesive material on the FPCB 121. In one embodiment of the present invention, a conductive material, in particular, a conductive epoxy resin is used as the second die bonding pad 127c. Using the second die bonding pad 127c made of a conductive material, the drain terminal of the first FET chip 127a and the drain terminal of the second FET chip 127b are electrically connected to each other through the second die bonding pad 127c.

The thickness of the second die bonding pad 127c (i.e., the adhesive material) is approximately 0.03 mm in one embodiment. In other embodiments, the thickness of the second die bonding pad 127c may be less than 0.03 mm. In still other embodiments, the thickness of the second die bonding pad 127c may be about 0.01 mm or less. The area of the second die bonding pad 127c is larger than the total area of the two FETs 127a and 127b.

For convenience of mounting, the second die bonding pad 127c has a shape similar to the shape of the two FET chips 127a and 127b together, and the ratio of dimensions between the second die bonding pad 127 and the two FET chips 127a and 127b together according to one embodiment is at least 1.2:1, but the present invention is not limited thereto. In other words, the length and width of the second die bonding pad 127 respectively are at least 1.2 times those of the combined area of the FETs 127 and 127b. In other embodiments, the ratios may be more or less than 1.2.

Second, third, fourth, and fifth wire bonding pads 127d, 127e, 127f, and 127g spaced apart from the second die bonding pad 127c are disposed around the second die bonding pad 127c. The second wire bonding pad 127d and the third wire bonding pad 127e are located adjacent to the first FET chip 127a, and the fourth wire bonding pad 127f and the fifth wire bonding pad 127g are located adjacent to the second FET chip 127b. In one embodiment, the second, third, fourth, and fifth wire bonding pads 127d, 127e, 127f, and 127g are formed by plating copper foil formed in the FPCB 121 with gold. In other embodiments, any other suitable material can be used to plate the copper foil.

Second, third, fourth, and fifth wires 127h, 127j, 127k, and 127m are electrically connected to the second, third, fourth, and fifth wire bonding pads 127d, 127e, 127f, and 127g, respectively, by a method such as wire bonding. The second wire 127h is electrically connected to a gate terminal of the first FET chip 127a by a method such as wire bonding. The third wire 127j is electrically connected to a source terminal of the first FET chip 127a by a method such as wire bonding. The fourth wire 127k is electrically connected to a gate terminal of the second FET chip 127b by a method such as wire bonding. The fifth wire 127m is electrically connected to a source terminal of the second FET chip 127b by a method such as wire bonding.

In one embodiment, when the wires 127h, 127j, 127k, and 127m are connected to the terminals formed on the two FET chips 127a and 127b, the upper ends of the wires 127h, 127j, 127k, and 127m are located approximately 0.2 mm or less above the two FET chips 127a and 127b. In other embodiments, the upper ends of the wires 127h, 127j, 127k, and 127m may be located less than or equal to about 0.1 mm above the FET chips 127a and 127b. In the described embodiment, the second, third, fourth, and fifth wires 127h, 127j, 127k, and 127m are made of gold, but the present invention is not limited thereto. The wires 127h, 127j, 127k, and 127m may be made of other suitable conductive material such as copper, aluminum, or nickel, as well as gold.

In one embodiment of the present invention, the switch 127 has the two switching devices 127a and 127b, but the present invention is not limited thereto. Although not illustrated, a device formed by integrating two switching devices, i.e., a device in which two FETs are formed in one chip, may be used.

It can be seen in FIG. 6 that the second and fourth wire bonding pads 127d, 127f are mounted on a portion of the FPCB 121 after peeling the external insulating layer to expose the underlying conductive material (e.g., copper foil.). While not shown in FIG. 6, the third and fifth wire bonding pads 127e and 127g would similarly be mounted on the FPCB 121 after removing the underlying insulating layer. Then a suitable conductive material (e.g., gold) is plated on the exposed conductive material FPCB 121 to form the contacts 127d' and 127f' shown in FIG. 6. This way, electrical connections can be formed between the FETs 127a, 127b and the FPCB 121 via the respective second, third, fourth and fifth wires 127h, 127j, 127k, and 127m and the respective second, third, fourth and fifth wire bonding pads 127d, 127e, 127f and 127g.

Referring to FIGS. 2 and 4 to 7, the protector 128 is a molded portion formed on the FPCB 121. The protector is formed by coating a protective material such that the IC chip 126, the first die bonding pad 126a, the two FET chips 127a and 127b, the second die bonding pad 127c, the wire bonding pads 126b, 127d, 127e, 127f, and 127g, and the wires 126c, 127h, 127j, 127k, and 127m are encapsulated therein.

In one embodiment of the present invention, the protector is made of an epoxy resin, but the present invention is not limited thereto. In other words, the protector may be made of any other suitable material such as silicon. In one embodiment, the upper end of the protector 128 is located approximately 0.1 mm or less above the upper ends of the wires 126*b*, 127*d*, 127*o*, 127*f*, 126*c*, 127*h*, 127*j*, 127*k*, and 127*m*. In one embodiment, the upper end of the protector is located about 0.05 mm or less above the highest point of the wires between the control circuitry (including the IC chip 126 and the switch 127) and the FPCB 121. In some embodiments, the distance measured from a lower surface (i.e., the surface opposite the surface on which the chip mount is located) of the FPCB 121 and the top of the protector is about 0.5 mm or less. The protector 128 may be formed by dropping liquefied epoxy resin onto a corresponding region, for example. The protector 128 insulates the parts accommodated therein from the outside and prevents the wires from being circuit-shorted or broken by an external impact.

In one embodiment, the thickness of the FPCB 121 is approximately 0.1 mm, the thickness of the die bonding pad 126*a* and 127*c* formed on the FPCB 121 is approximately 0.03 mm, and the thickness of the IC chip 126 that is the thickest chip mounted onto the die bonding pads 126*a* and 127*c* is approximately 0.22 mm. The wire 126*c* extends approximately 0.1 mm above the IC chip 126 and the upper end of the protector 128 is located approximately 0.05 mm above the upper end of the wire 126*c*. According to embodiments of the present invention, the protection circuit module 120 may be slimmed such that the total thickness thereof is approximately 0.5 mm.

Figure 8:
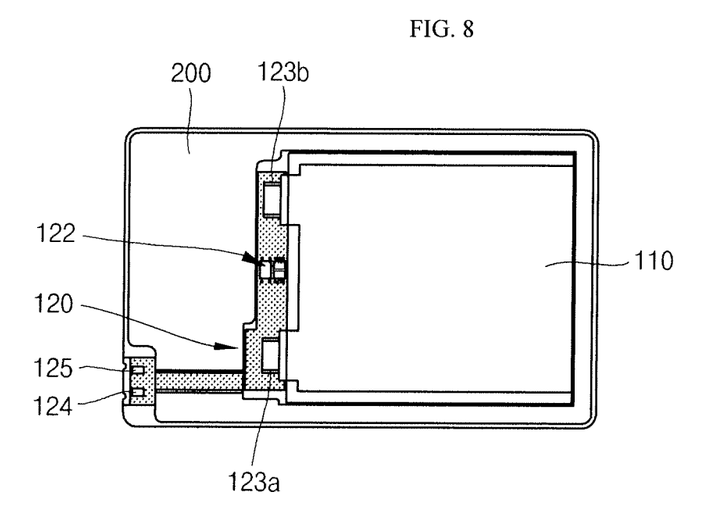
FIG. 8 is a schematic perspective view of a core pack including the bare cell and the protection circuit module of the secondary battery according to one embodiment of the present invention.

FIG. 8 is a schematic perspective view of a core pack 200 of the secondary battery 100 that includes the bare cell 110 and the protection circuit module 120. As can be seen in FIG. 8, the protection circuit module 120 is mounted directly on the bare cell 110, so as to reduce the size of the resulting core pack 200. In some embodiments, the protection circuit module 120 may be mounted on a hard material fixture for providing structural support to the FPCB 121.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined by the appended claims.

What is claimed are:

1. A protection circuit module (PCM) for a secondary battery comprising a bare cell, the PCM comprising:
    a flexible printed circuit board (FPCB);
    control circuitry mounted on the FPCB via adhesive material and configured for electrical coupling to the bare cell through the FPCB, the control circuitry being adapted to control charging and discharging of the bare cell, the control circuitry comprising a controller and a switch comprising a first switching device and a second switching device;
    a plurality of first wire bonding pads on the FPCB around the controller, wherein the controller is electrically coupled to the first wire bonding pads via first wires; and
    a plurality of second wire bonding pads on the FPCB around the first and second switching devices, wherein the first and second switching devices are electrically coupled to the second wire bonding pads via second wires.

2. The PCM of claim 1 wherein each of the wire bonding pads comprises a conductive material on an exposed copper of the FPCB.

3. The PCM of claim 2 wherein the conductive material comprises gold.

4. The PCM of claim 2 wherein each of the wires comprises a conductive material selected from the group consisting of gold, copper, aluminum, nickel, and combinations thereof.

5. A secondary battery comprising:
    a bare cell; and
    a protection circuit module (PCM) electrically coupled to the bare cell, the PCM comprising:
        a flexible printed circuit board (FPCB);
        control circuitry mounted on the FPCB via adhesive material and electrically coupled to the bare cell through the FPCB, the control circuitry being adapted to control charging and discharging of the bare cell, the control circuitry comprising a controller and a switch comprising a first switching device and a second switching device;
        external terminals electrically coupled to the control circuitry via the FPCB and for electrically coupling the bare cell to an external device;
        a plurality of first wire bonding pads on the FPCB around the controller, wherein the controller is electrically coupled to the first wire bonding pads via first wires; and
        a plurality of second wire bonding pads on the FPCB around the first and second switching devices, wherein the first and second switching devices are electrically coupled to the second wire bonding pads via second wires.

6. The secondary battery of claim 5, wherein each of the wire bonding pads comprises a conductive material on an exposed copper of the FPCB.

7. The secondary battery of claim 6, wherein the conductive material comprises gold.

8. The secondary battery of claim 6, wherein each of the wires comprises a conductive material selected from the group consisting of gold, copper, aluminum, nickel, and combinations thereof.

* * * * *

UNITED STATES PATENT AND TRADEMARK OFFICE
CERTIFICATE OF CORRECTION

PATENT NO. : 8,547,068 B2  
APPLICATION NO. : 12/548302  
DATED : October 1, 2013  
INVENTOR(S) : Bong Young Kim Page 1 of 1

It is certified that error appears in the above-identified patent and that said Letters Patent is hereby corrected as shown below:

In the Claims

| | |
|---|---|
| Column 7, line 46 | Delete "are", Insert -- is -- |
| Column 8, Claim 2, line 12 | Delete "1", Insert -- 1, -- |
| Column 8, Claim 3, line 14 | Delete "2", Insert -- 2, -- |
| Column 8, Claim 4, line 16 | Delete "2", Insert -- 2, -- |

Signed and Sealed this  
Twenty-fifth Day of November, 2014

Michelle K. Lee  
*Deputy Director of the United States Patent and Trademark Office*